United States Patent
Shiina et al.

(10) Patent No.: US 7,823,537 B2
(45) Date of Patent: Nov. 2, 2010

(54) PLASMA GENERATOR

(75) Inventors: Yuichi Shiina, Chuo-ku (JP); Hirofumi Takikawa, 1-3(1-104), Aza Uehara, Ogasakicho, Toyohashi-city, Aichi (JP) 441-8066

(73) Assignees: Ferrotec Corporation, Tokyo (JP); Hirofumi Takikawa, Aichi (JP)

( * ) Notice: Subject to any disclaimer, the term of this patent is extended or adjusted under 35 U.S.C. 154(b) by 1042 days.

(21) Appl. No.: 10/592,286

(22) PCT Filed: Feb. 17, 2005

(86) PCT No.: PCT/JP2005/002477

§ 371 (c)(1), (2), (4) Date: Sep. 8, 2006

(87) PCT Pub. No.: WO2005/089031

PCT Pub. Date: Sep. 22, 2005

(65) Prior Publication Data

US 2007/0193518 A1   Aug. 23, 2007

(30) Foreign Application Priority Data

Mar. 16, 2004   (JP)   ............................. 2004-075091

(51) Int. Cl.
*C23C 16/00* (2006.01)
(52) U.S. Cl. .................................................. 118/723 R
(58) Field of Classification Search ................ 118/722, 118/723 VE, 723 HC, 723 R; 204/192.38
See application file for complete search history.

(56) References Cited

U.S. PATENT DOCUMENTS 3,825,789 A * 7/1974 Harris ......................... 218/130
3,911,239 A * 10/1975 Lafferty ....................... 218/121
4,512,867 A * 4/1985 Andreev et al. ........... 204/298.41
4,645,895 A * 2/1987 Boxman et al. ............ 219/76.13
4,915,977 A * 4/1990 Okamoto et al. ............. 427/580
6,319,369 B1   11/2001 Flynn et al.
6,495,002 B1 * 12/2002 Klepper et al. ........... 204/192.38
2004/0124080 A1* 7/2004 Murakami et al. ....... 204/298.41

FOREIGN PATENT DOCUMENTS

| JP | 56-151173 | 11/1981 |
| JP | 3-110729 | 5/1991 |
| JP | 9-285865 | 11/1997 |
| JP | 11-329172 | 11/1999 |
| JP | 11-350115 | 12/1999 |
| JP | 2001-192815 | 7/2001 |

* cited by examiner

*Primary Examiner*—Parviz Hassanzadeh
*Assistant Examiner*—Michelle Crowell
(74) *Attorney, Agent, or Firm*—William L. Androlia; H. Henry Koda

(57) ABSTRACT

A plasma generator for forming a thin film comprises a cathode (4) for supplying constituent particles of an arc plasma and a trigger-and-anode (6) for starting and sustaining the arc plasma. The cathode surface (4a) of the cathode (4) is flat or finely irregular, and the anode surface (6c) of the trigger-and-anode (6) brought into contact with the cathode surface (4a) is flat. The anode surface (6c) is so arranged as to be brought into contact with the whole cathode surface (4a) when plasma is started. The contact point between a fine projection end (4b) of the cathode surface (4a) and the anode surface (6c) is made a plasma emission point. When the projection is consumed by plasma emission, another projection end which can be brought into contact with the anode surface (6c) is used as another plasma emission point, thus enabling intermittent operation of persistently repeating the sequence operation.

5 Claims, 8 Drawing Sheets

PLASMA GENERATOR

The present invention relates to a plasma generator in which plasma can be generated by performing of a vacuum arc discharge. More particularly, the present invention relates to a plasma generator in which, in a case of repeating a sequence operation including start, sustaining and stop of the plasma for a long time, a projection end of a cathode surface having finely irregular shape becomes a plasma emission point in the cathode surface emitting the plasma, and another projection end becomes a new plasma emission point in next start of plasma when said projection end is consumed by emission of plasma, so that the plasma can be produced intermittently for a long time.

BACKGROUND ART

In general, it is known that the surface properties of solid are improved by forming a thin film on the surface of solid material in plasma, or by injecting ions into the surface. A film formed by use of plasma including metal ions and nonmetal ions strengthens abrasion resistance and corrosion resistance of the solid surface, so that said film is understood to be useful as an overcoat, an optical film and a transparent electro-conductive film. In particular, a carbon film formed by using of carbon plasma has the high utility value as a diamond-like carbon film (called DLC film) being a mixed crystal consisting of diamond structure and graphite structure.

As a method to generate the plasma including the metal ions and the nonmetal ions, there is a vacuum arc plasma method. The vacuum arc plasma is generated by an arc discharge occurring between cathode and anode, and is the plasma formed by cathode evaporation substance of the cathode material that evaporates from a cathode point existing on the cathode surface. In addition, when reactivity gas or/and non-active gas (rare gas etc.) are introduced as atmosphere gas, the reactivity gas or/and non-activity gas also are ionized at the same time. By performing film formation and ion injection to solid surface using such plasma, the surface treatment can be done.

In a plasma generating portion of the plasma generator, under the state that an electric current is flowing between the cathode and the trigger electrode which come in contact mutually, the plasma generation is induced by separating the cathode and the trigger electrode. In the plasma generating portion, vacuum arc plasma constituent particles such as cathode material ions, electrons and cathode material neutral particles are emitted by vacuum arc discharge, and at the same time, cathode material fine particles (called droplets as follows) in size from submicrons to several hundred microns (0.01-1000 μm) are emitted, too.

One part of the present inventors proposes a plasma processing method using the vacuum arc discharge described above. This method is published as Japanese Patent Laid-Open No. 2002-8893 (Patent Document 1) and is shown in FIG. 7. FIG. 7 is a schematic diagram of the plasma generating portion 102 in a conventional plasma generator. In the plasma generating portion 102 arranged in a vacuum chamber, as the preceding step for generating the plasma 108 between cathode 104 and anode 140, an electric spark is occurred by trigger electrode 106 and then the generation of plasma 108 is induced. It is not illustrated, but a driving device which can drive up and down is provided near the trigger electrode 106, so that the tip of trigger electrode 106 comes into contact with cathode surface 104a by the driving device and the voltage is applied to a contact point by arc power supply 122. An electric current concentrates on this contact point, and when the trigger electrode 106 is separated from the cathode surface 104a, the electric spark occurs and the generation of plasma 108 is induced.

However, an emission bore 104b is formed on the cathode surface 104a when the plasma 108 occurred. Namely, the plasma generating substance forming cathode material in this emission bore 104b is emitted as the plasma constituent particles and droplets 118. When the trigger electrode 106 approaches said emission bore 104b, the generation of plasma 108 cannot be induced because a desirable contact state is not formed between the trigger electrode 106 and the cathode 104.

As a means for solving the problem of the emission bore formation on said cathode material surface, in an electrode constitution disclosed by Japanese Patent Laid-Open No. 2001-192815 (Patent Document 2), an abrasion device reproducing the cathode material surface to the shape of a plane is disposed with a driving device to turn the cathode material. It is not illustrated, but even when the plasma generator of FIG. 7 is intermittently operated for a long time, a cathode turning mechanism device rotating said cathode 104 in which the rotational axis of cathode 104 is a center line perpendicular to a bottom of the plasma generating portion needs to be disposed with an abrasion device abrading the cathode surface by a grinder. That is to say, in the case generating the next plasma after the formation of emission bore 104b, in order to assure a desirable contact between the trigger electrode 106 and the cathode surface 104a, the contacting point of the trigger electrode 106 with the cathode 104 is sequentially shifted by turning the cathode 104 using said cathode turn mechanism device.

Furthermore, since a lot of emission bores 104b are formed on the cathode surface 104a by repeating the vacuum arc discharge, it is necessary for the cathode surface 104a to be ground with the abrasion device by stopping the intermittent generation of plasma 108 at one time. Since the flat cathode surface 104a is formed newly by this abrasion process, the trigger electrode 106 and the flat cathode surface 104a always comprise a good contact state and the generation of plasma 108 can be induced again. However, while the cathode surface 104a is being ground, the intermittent generation of plasma 108 is stopped at one time and therefore it made reduce the operation efficiency of the plasma generator. In addition, since mine dusts occurring in the abrasion process pollute the vacuum chamber and deteriorate the quality of formed film, collection of the mine dust and cleaning of the vacuum chamber were necessary.

Conventional trigger electrode 106 shown in FIG. 7 is arranged in proximity to the cathode surface 104a. In this case, deterioration of the trigger electrode 106 becomes early because it is exposed to plasma 108 and heated. In addition, the membrane that accumulated to the trigger electrode 106 exfoliates and is mixed to plasma 108 as contamination matter so that the problems to obstruct advance of plasma 108 is brought about. In order to solve these problems, a driving mechanism moving the trigger electrode to a plasma collision avoiding position is provided with the plasma generator disclosed by U.S. Pat. No. 6,319,369B1 (Patent Document 3), and the plasma generating portion of patent document 3 is shown in FIG. 8.

FIG. 8 is a schematic diagram of the plasma generating portion in a conventional plasma generator. A cathode cooling member 164 with inflow portion 161 and outflow portion 162 of a coolant is installed by flanges 165, 168, and the cathode 104 is fixed to the upper part of said cathode cooling member 164 by a fixing member 169. A magnetic coil 168 installed around the anode 140 makes converge plasma, and an induction magnetic field leading the plasma to a plasma drawing portion (not shown, upper direction of drawing) is formed. In addition, baffle plates 173 suppressing the progress of droplets reflected by a side wall, introduction portion 134 of reaction gas and observation window 166 are arranged.

In FIG. 8, the trigger electrode 106 and the surface of cathode 104 are in a contact state. When the trigger electrode 106 is separated from the cathode surface due to the driving mechanism in such a contact state, a cathode point is formed at the position where tip end portion 106a of the trigger electrode 106 and the cathode surface were contacting each other, so that arc plasma is formed in the direction from this cathode point to anode 140. In addition, said driving mechanism is controlled by means of controller 167. In order to prevent deterioration of trigger electrode 106 based on heating and mixture of contamination to the plasma and not to obstruct advance of said plasma, the trigger electrode 106 is stored at the plasma collision avoiding position (position of trigger electrode shown in broken line). However, since the emission bore of plasma is formed on the surface of cathode 104 in FIG. 8, it is necessary to install the trigger control device and the abrasion device as well as FIG. 7, and is necessary to wash the vacuum chamber frequently.

[Patent Document 1] Japanese Patent Laid-Open No. 2002-8893

[Patent Document 2] Japanese Patent Laid-Open No. 2001-192815

[Patent Document 3] U.S. Pat. No. 6,319,369

DISCLOSURE OF THE INVENTION

Problems to be Solved by the Invention

When, in semiconductor production processes, a plasma processing is continuously performed on processed object, it is necessary to operate intermittently the plasma generator for a long time, and whenever the cathode material forming cathode 104 is consumed, new cathode material must be supplied continuously. However, when the cathode material is installed by opening the vacuum chamber, impurities and contamination matters are mixed in the vacuum chamber. Therefore, when the supplying number of times of cathode material increased, it was hard to avoid the pollution in vacuum chamber.

In addition, since a plurality of emission bores 104b are formed on the cathode surface 104a with increase of the contact number of times with the trigger electrode 106, there was necessity to form the flat cathode surface again by grinding the cathode surface 104a regularly to operate the plasma generator intermittently for a long time. Therefore, the abrasion device of cathode surface is provided with the conventional plasma generating portion, so that the generation of plasma had to be stopped at one time in abrasion processing of cathode surface 104a. Namely, the abrasion processing decreased remarkably the handling efficiency of surface treatment processing by the use of the plasma generator.

Therefore, it is the object of the present invention to realize a plasma generator which can perform intermittent operation of repeating a sequence operation including start, sustaining and stop of a cathode arc (vacuum arc) plasma for a long time.

Means to Solve the Problems

The present invention is proposed to solve said problems, and the first form of the present invention is a plasma generator in which a plasma is generated by a vacuum arc discharge performed in a plasma generating portion set under a vacuum atmosphere, and generate plasma, and said plasma generator characterized in that a trigger-and-anode for starting and sustaining of said vacuum arc plasma and a cathode are arranged in said plasma generating portion, a cathode surface of said cathode is flat or finely irregular, an anode surface of said trigger-and-anode brought into contact with said cathode surface is flat, said anode surface is so arranged as to be brought into contact at least with said whole cathode surface when said plasma is started and a contact point between a fine projection end of said cathode surface and said anode surface becomes a plasma emission point.

The second form of the present invention is the plasma generator according to said first form, wherein a driving mechanism is provided at said trigger-and-anode, so that said trigger-and-anode can move for repetition between an arc plasma starting position and a plasma collision avoiding position by said driving mechanism.

The third form of the present invention is the plasma generator according to said first form, wherein a driving mechanism is connected to a base end portion of said trigger-and-anode, so that said trigger-and-anode can swing for repetition between an arc plasma starting position and a plasma collision avoiding position as a fulcrum in said driving mechanism.

The fourth form of the present invention is the plasma generator according to any of first to third forms, wherein said trigger-and-anode is formed in a hammer shape having an anode base end portion of a narrow width and an anode tip end portion of wide width, and a tip end surface of said anode tip end portion becomes said anode surface.

The fifth form of the present invention is the plasma generator according to any of first to fourth forms, wherein a permanent magnet or an electromagnet is arranged at said trigger-and-anode.

The sixth form of the present invention is the plasma generator according to any of first to fifth forms, wherein a tip end portion of said trigger-and-anode is composed of a plasma generating substance.

The seventh form of the present invention is the plasma generator according to any of first to sixth forms, wherein a cathode material loading device which supplies sequentially a cathode material forming said cathode to said plasma generating portion is installed, so that said cathode material located at the most top in a plurality of cathode materials arranged in series becomes said cathode, and a following cathode material advances so as to become new cathode when said cathode was consumed.

The eighth form of the present invention is the plasma generator according to seventh form, wherein a storage room accommodating said cathode materials is disposed, so that said cathode material is supplied to said cathode material loading device.

EFFECTS OF THE INVENTION

According to the first form of the present invention, by bringing the projection end of cathode surface having flatness or minute unevenness shape into contact with the anode surface having flat surface, the arc plasma generation can be induced through flowing of electric current into said contact point. When said projection end evaporated by emission of arc plasma, at the time of next plasma start, another projection end which can be brought into contact with said anode surface becomes a new plasma emission point, and the plasma can be generated persistently. The tip of conventional trigger-and-anode is formed in the shape of a stick. Accordingly, when the plasma is generated by making the trigger-and-anode come in contact with said cathode surface, the emission bore having the size of tip diameter of said trigger-and-anode is formed on said cathode surface. In a vacuum arc discharge, the cathode material with which the emission bore was filled is emitted as plasma or droplets. In addition, since cathode point has a property to move without staying in a constant point, the cathode surface is damaged slowly with increasing of the number of times even if it is an electric discharge of a short time for around several seconds. In general, circumference of the place where the trigger electrode contacts with is eroded. Therefore, in the plasma generator performing persistently the intermittent repetition such as start, sustaining and stop for a long time, it was necessary that the abrasion member grinding the cathode surface is disposed and the cathode surface is ground regularly. However, a large quantity of mine dust occurs by the grinding process and then pollution in vacuum chamber was caused. In addition, said pollution was one of causes falling the operation efficiency of the plasma generator.

In the plasma generator of the present invention, the plasma occurs from the plasma emission point that the projection end formed on cathode surface contacts with anode surface, and when this projection end evaporated, at next start time of plasma, another projection end capable of contacting with said anode surface becomes new plasma emission point. Even when some projection ends evaporate sequentially, the minute unevenness shape of cathode surface is held because the projection ends are formed in sequence, so that the plasma can be generated persistently from said cathode surface and the generation of plasma is realized stably and intermittently without opening of the vacuum chamber. Besides, since the cathode surface is consumed uniformly during long time, the cathode surface gradually retreats, so that the vacuum arc discharge continues till the cathode material disappears and the continuous generation of plasma is enabled until perfect disappearance of cathode.

According to the second form of the present invention, the driving mechanism is provided with the trigger-and-anode and by this driving mechanism, the trigger-and-anode can move for repetition between the plasma starting position and the plasma collision avoiding position. When said trigger-and-anode is separated from cathode surface, a cathode point is formed on the cathode surface, and the vacuum arc plasma is formed diffusely from said cathode point toward the trigger-and-anode direction through an electric field. Furthermore, most of vacuum arc plasma occurred diffusely can be sent to drawing side by moving the trigger-and-anode to the plasma collision avoiding position. In addition, since one part of plasma constituent particles arrive at the trigger-and-anode, the electric discharge can be maintained.

According to the third form of the present invention, since the driving mechanism is connected to the base end portion of said trigger-and-anode so that said trigger-and-anode can swing for repetition between the plasma starting position and the plasma collision avoiding position as a fulcrum in said driving mechanism, the stable swing motion of said trigger-and-anode can be realized. Swing of the trigger-and-anode as a fulcrum in the driving mechanism draws an arc-shaped orbit, and the trigger-and-anode can move from the plasma starting position to the plasma collision avoiding position smoothly, while sweeping the plasma by the voltage applied between cathode and trigger-and-anode.

According to the fourth form of the present invention, since said trigger-and-anode is formed in the hammer shape having an anode base end portion of a narrow width and an anode tip end portion of wide width, said cathode surface can completely abut with the entire surface of anode surface at the time of plasma start, and a good contact state between the anode surface and projection end can be assured. In addition, since the position of center of gravity of trigger-and-anode is located at the anode tip end portion side, said swing motion of this trigger-and-anode can be composed from a single pendulum-like stable repetition motion.

According to the fifth form of the present invention, since the permanent magnet or the electromagnet is arranged at tip end portion of said trigger-and-anode, a plasma stream to maintain the arc discharge can be concentrated to the central portion of said trigger-and-anode and it can be prevented that a membrane bonds to circumference of said trigger-and-anode. When an electro-conductive membrane bonds to an insulator of anode circumference, its part also acts as an anode and as a result, the use efficiency of evaporation material decreases because the evaporation material occurred from the cathode point is transported toward said part. In addition, said trigger-and-anode can be used as an active anode. That is to say, when the permanent magnet or the electromagnet is arranged at the tip end portion of said trigger-and-anode so that an arc electric current is concentrated to the central portion of said trigger-and-anode, the plasma spreading in front of the anode surface of said trigger-and anode is converged and accordingly activation and high ionization can be achieved. Magnet can be disposed in the inside of trigger-and-anode or the outside. Especially, when the magnet is buried in the inside of anode, the effectiveness of magnet increases because the magnet surface does not touch with cathode. Plasma is concentrated to the vicinity of anode surface by electromagnetic interaction (Lorenz force) between the magnetic field of the permanent magnet or electromagnet and the plasma, so that a plasma high-density domain (plasma plume) can be formed. When neutral atoms emitted from the cathode is incident to the plasma plume, the neutral atoms are formed to plasma components by ionization, so that the plasma can be generated with high efficiency because said trigger-and-anode composes an active anode. Namely, one part of the neutral particles occurring from the cathode can be ionized by making said trigger-and-anode active. In other words, since one part of the neutral particles not contributing for layering can be utilized, it can make the speed of layering increase.

According to the sixth form of the present invention, the tip end portion of the trigger-and-anode is composed of plasma generating substance, a plasma composed of substance different from cathode can be generated. For example, in a case that the ZnO membrane mixed with Al is formed on the processed object surface, it was necessary to compose the cathode by the alloy in which Al and Zn were mixed. In other words, since the composition ratio of a generated membrane is dependent upon the composition ratio of alloy, it was difficult to control the composition ratio of said generated membrane freely. In the premise that the trigger-and-anode of the present invention is formed from plasma generating substance, the plasma including the cathode material and another different material can be generated by composing said trigger-and-anode as an active anode (active anode can vaporize an anode material of a very small amount from the anode surface by concentrating an electric current more). Therefore, in the surface treatment processing, various plasma processing can be performed depending on utilization purpose. In addition, the active anode can be formed by burying the plasma generating substance under the anode surface. Furthermore, by means of arranging the permanent magnet or the electromagnet on the anode tip, the plasma is concentrated to the vicinity of the anode surface, so that the anode surface oneself or the plasma generating substance surface is heated by heat of plasma and ion-electron bombardment, and the generation efficiency of plasma from the cathode surface can be improved still more.

According to the seventh form of the present invention, the cathode material loading device supplying sequentially the cathode material to said plasma generating portion is installed, so that a new cathode is momentarily set by supplying the following cathode material instantaneously when the cathode was consumed. In the vacuum arc processing method, it is desirable for vacuum chamber not to be opened as much as possible to prevent the mixture of impurities and contamination from the outside. By installing the cathode material loading device of the present invention, cathode materials can be supplied without opening or closing of vacuum chamber, so that the plasma of high density can be generated continually for a long time.

According to the eighth form of the present invention, as the storage room that accommodated cathode materials is placed, the cathode materials can be supplied to the cathode material loading device, so that the plasma can be generated continually for a long time. When a plurality of processed objects are set in the processing portion, the plasma processing can be carried out without interruption of the processing process. Furthermore, when the cathode materials are supplied, the cathode materials can be supplied sequentially without opening of the vacuum chamber, so that mixture of impurities and contamination can be restrained.

EXPLANATION OF REFERENCE NUMERALS

Figure 1:
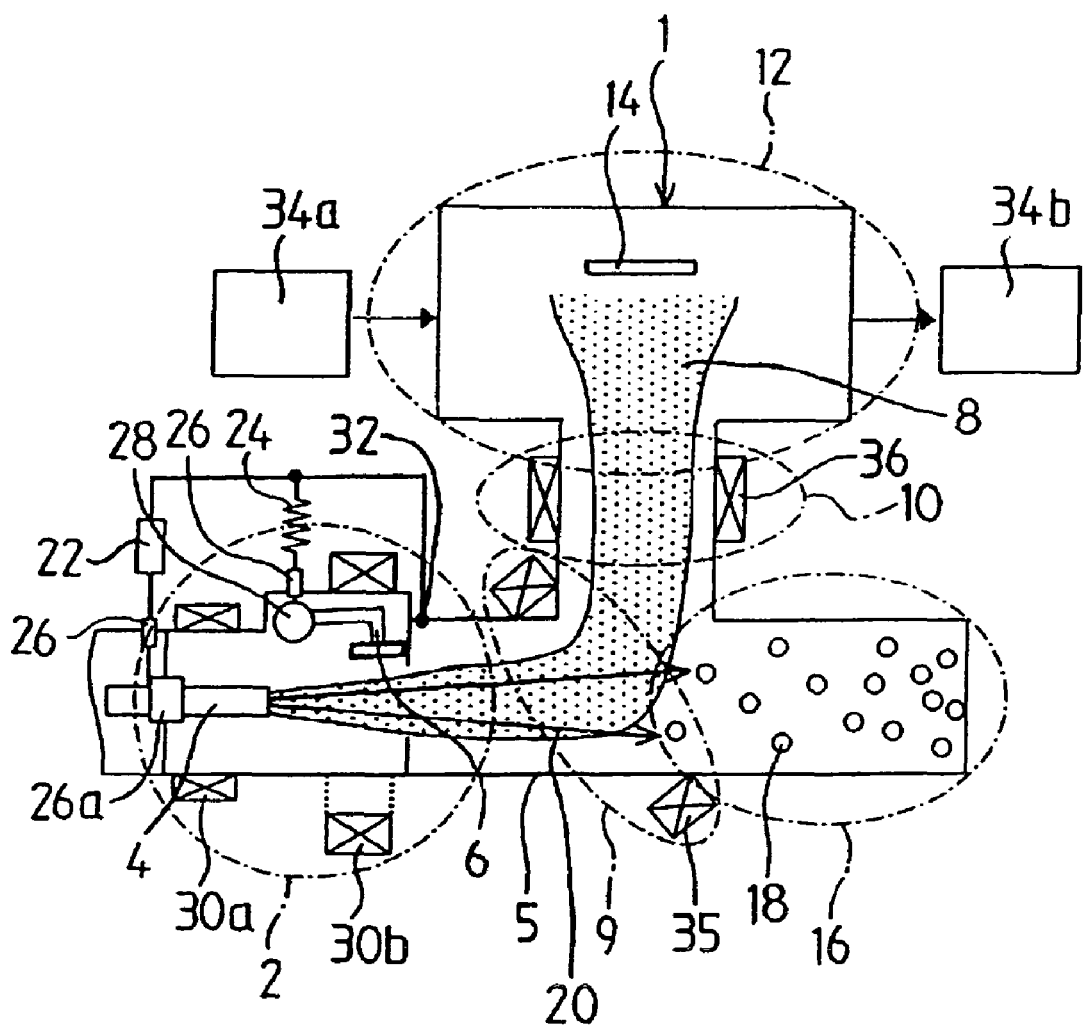
FIG. 1 is a sectional schematic diagram of a plasma generator of the present invention.

1 vacuum chamber
2 plasma generating portion
3 cathode material loading device
4 cathode
4*a* cathode surface
4*b*, 4*f* projection end
4*c* cathode extra material
4*d*, 4*e* projection
5 plasma transporting duct
6 trigger-and-anode
6*a* tip end portion
6*b* base end portion
6*c* anode surface
6*d* magnet
6*e* plasma collision avoiding position
6*f* plasma generating substance
8 plasma
9 first plasma guiding portion
10 second plasma guiding portion
12 plasma processing portion
14 processed object
16 droplet capturing portion
18 droplets
20 droplet emission direction
22 arc power supply
24 limit resistance
26 insulation introduction terminal
26*a* insulation introduction terminal
28 driving mechanism
30*a* arc-stabilizing magnetic field generator
30*b* arc-stabilizing magnetic field generator
32 connection terminal
34*a* gas introduction system
34*b* gas exhaust system
35 induction magnetic field generator
36 induction magnetic field generator
38*a* cathode material ion
38*b* cathode material ion
40 electron
42 neutral atom or molecule
43 plasma high-density domain (plasma plume)
44 magnetic field
46*a* neutral atom emission direction
46*b* cathode material ion emission direction
46*c* cathode material ion emission direction
48 electronic orbit
48*a* electronic orbit
50 storage room
52 loading member
54 vacuum bellows
56 supporting member
58 pushing out mechanism
60 loading portion
102 plasma generating portion
104 cathode
104*a* cathode surface
104*b* emission bore
106 trigger electrode
108 plasma
118 droplet
120 droplet emission direction
122 arc power supply
124 limit resistance
126 insulation introduction terminal
130*a* arc-stabilizing magnetic field generator
130*b* arc-stabilizing magnetic field generator
134 introduction portion
140 anode
161 inflow portion
162 outflow portion
164 cathode cooling member
165 flange
166 observation window
167 controller
168 flange 169 fixing member
173 baffle plate

BEST MODE FOR CARRYING OUT THE INVENTION

Embodiments of a plasma generator of the present invention are explained based on the attached drawings in detail as follows. In the present invention, the plasma generator includes both the device that installs the plasma processing portion processing the processed object and the device that does not install the plasma processing portion. The plasma generator having the plasma processing portion may be called the plasma processing device. In other words, said plasma generator may be also called a vacuum arc evaporation device, a vacuum arc plasma evaporation device, a cathode arc evaporation device, or an arc ion plating device. Said evaporation device may be referred to as a layering device, a membrane forming device, or a coating device. In addition, said plasma generator can be used for injecting ions. FIG. 1 is a sectional schematic diagram of the plasma generator concerning the present invention. By providing the plasma processing portion with said plasma generator, said generator becomes the plasma processing device.

The plasma generator of FIG. 1 is basically configured from a plasma generating portion 2 formed in a vacuum chamber 1, a droplet capturing portion 16, a first plasma guiding portion 9, a second plasma guiding portion 10 and a plasma processing portion 12. In said plasma generating portion 2, a cathode 4 and a trigger-and-anode 6 are connected to an outside arc power supply 22 through an insulation introduction terminal 26. For this arc power supply 22, a general-purpose dc power supply, a pulse power supply, a dc superimposed pulse power supply, or an ac superimposed dc power supply can be used as a power supply which can occur a vacuum arc discharge. In addition, a limit resistance 24 (0.1-10Ω) for restricting (adjusting) an electric current flowing into the trigger-and-anode 22 may be interposed between the trigger-and-anode 6 and the arc power supply 22. But, as for the more preferred form in this case, other supporting anodes are installed. In FIG. 1, a power supply is connected to a plasma transporting duct 5, so that said plasma transporting duct 5 oneself also serves as said supporting anode. Of course, in the state that said plasma transporting duct 5 is float electrically by insulation, another supporting anode (not illustrated) can be laid in a duct. Furthermore, this supporting anode can be used as an active anode.

In said plasma generating portion 2, the plasma 8 and the droplets 18 from cathode 4 are generated in a mixture state. Because the droplets 18 occurring from said cathode 4 are neutral electrically and are not influenced by magnetic field, they have a property of going straight. As shown in FIG. 1, a progress direction of droplets 18 and a progress direction of plasma 8 are branched off like T-shape in the plasma transporting duct 5, and then said plasma 8 is curvedly led to the second plasma guiding portion by synthesized magnetic field formed at the first plasma guiding portion 9 by means of induction magnetic field generator 35.

Said droplets 18 travel to the droplet capturing portion 16 and said plasma 8 travels to the second plasma guiding portion 10 by magnetic field. Furthermore, there is disposed the plasma processing portion 12 which performs the surface treatment processing for the processed object 14 by using of the plasma 8 traveling through the second plasma guiding portion 10. Reactivity gas can be introduced into said plasma processing method if necessary. In addition, the plasma processing device including the plasma processing portion is also called the plasma generator in the present invention and is included in the technical scope of the present invention.

The constituent particles of plasma 8 include the neutral particles such as molecules and atoms in plasma precursor state as well as the ionized charged particles (ion, electron) originated from the evaporation material vaporizing from cathode 4 of plasma generating portion 2, or the introduction gas with said evaporation material. Evaporation conditions in a plasma processing method (vacuum arc evaporation method) are as follows. The electric current is 1-600 A (preferably 5-500 A, more preferably 10-150 A). Furthermore, the voltage is 5-100V (preferably 10-80V, more preferably 10-50V), and the pressure is $10^{-10}$-$10^2$ Pa (preferably $10^{-6}$-$10^2$ Pa, more preferably $10^{-5}$-$10^1$ Pa).

There is a case that gas introduction is not performed to the plasma processing portion (treating portion) 12, but gas introduction system 34a and gas exhaust system 34b can be also connected. A general-purpose device can be employed for these systems. By controlling the gas introduction flow quantity uniformly and by adjusting the exhaust flow quantity, a vacuum degree (pressure) of the whole vacuum chamber 1 is controlled to be constant.

The introduction gas can be introduced from the plasma generating portion 2, and its gas may be also introduced from both the plasma processing portion (treating portion) 12 and the plasma generating portion 2. When the introduction gas is introduced from both the plasma processing portion and the plasma generating portion, the kinds of gases may be different. Furthermore, in one case that the reactivity gas is not used, rare gas (usually Ar, He) can be employed to hold the pressure to be constant, and in other case, the reactivity gas may be appropriately employed.

This reactivity gas reacts with the evaporation particles originated from sources such as cathode material, so that the double compounds membrane can be formed easily. As reactivity gas, there can be selectively employed one kind or plural kinds chosen from a group of nitrogen ($N_2$), oxygen ($O_2$), hydrogen ($H_2$), hydrocarbon gas ($C_2H_2$, $C_2H_4$, $CH_4$, $C_2H_6$ etc.), and oxidized carbon gas ($CO$, $CO_2$). In order to control the reactivity, the concentration of reactivity gas may be adjusted by mixing said rare gas. In addition, alcohol gas, organic metal gas or evaporation gas of organic metal liquid can be used as said reactivity gas.

Figure 2:
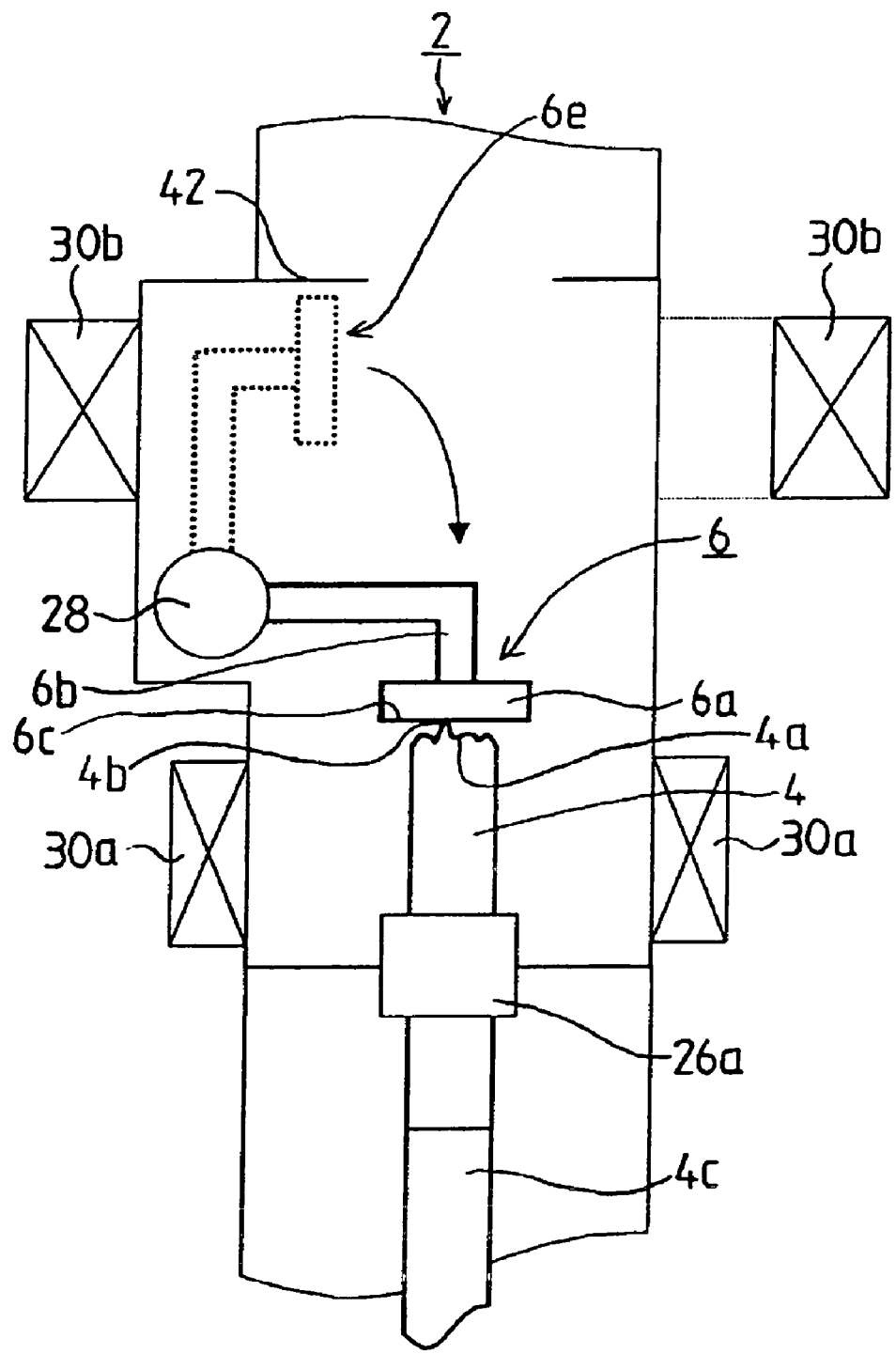
FIG. 2 is an enlarged diagram of the plasma generating portion in FIG. 1.

FIG. 2 is an enlarged diagram of plasma generating portion. The plasma generating portion 2 comprises the cathode 4, the trigger-and-anode 6, the arc-stabilization magnetic field generator (electromagnetic coil or magnet) 30a and 30b. Said cathode 4 is a source supplying the main component of plasma, and the formation materials are solid having electro-conductivity of which another properties are not especially limited. One kind of substance or more kinds of mixed substance of metal simple substance, alloy, inorganic simple substance, and inorganic compound (metal oxide, nitride) etc. can be used as said cathode material.

For said metal simple substance, there are Al, Ti, Zn, Cr, Sb, Ag, Au, Zr, Cu, Fe, Mo, W, Nb, Ni, Mg, Cd, Sn, V, Co, Y, Hf, Pd, Rh, Pt, Ta, Hg, Nd, Pb etc. In addition, for said alloy (metal compound), there are TiAl, AlSi, NdFe etc. Furthermore, for said inorganic simple substance, there are C, Si etc. Additionally, for said inorganic compound (ceramics), there are $TiO_2$, $ZnO$, $SnO_2$, ITO (Indium-Tin-Oxide: tin mixture indium oxide), $In_2O_3$, $Cd_2SnO_4$, $CuO$ and other oxides. Moreover, for carbide and said nitride, there are TiN, TiAlC, TiC, CrN, TiCN etc.

When it is desired for the trigger-and-anode material not to be vaporized, namely when the plasma of only cathode evaporation material should be generated, the material forming the tip end portion 6a of the trigger-and-anode 6 is an electro-conductive and non-magnetic solid which does not evaporate even at the plasma temperature. One kind of substance or more kinds of mixed substance of metal simple substance, alloy, inorganic simple substance, and inorganic compound (metal oxide, nitride) etc. can be used as said trigger-and-anode material. The materials that are employed for above-mentioned cathode 4 are chosen and used appropriately. It is desirable to form this trigger-and-anode 6 from stainless steel, copper or carbon materials (graphite).

By bringing the trigger-and-anode 6 into contact with the surface of the cathode 4 temporarily and separating them after that, the electric spark is generated between said cathode 4 and said trigger-and-anode 6. When this electric spark occurs, the electric resistance between cathode 4 and trigger-and-anode 6 decreases so that the vacuum arc occurs between said cathode and said trigger-and-anode. As for the formation materials of base end portion 6b of said trigger-and-anode, it is desirable for its material to be formed by stainless steel or copper. In more preferable form, the outer wall of base end portion 6b of trigger-and-anode 6 is insulated with ceramics etc, so that the function as the anode is given to only the tip 6a of trigger-and-anode. As formation material of trigger-and-anode 6a, its material is chosen from materials such as general-purpose Mo (melting point: 2610° C.) and W (melting point: 3387° C.) of high melting point metals, and carbon materials, preferably graphite.

The arc-stabilization magnetic field generator 30a and 30b are disposed around the vacuum chamber 1 in the plasma generating portion 2, so that the cathode point of vacuum arc and the plasma 8 generated by arc discharge are stabilized. When the arc-stabilization magnetic field generator 30a and 30b were disposed so that the magnetic fields applied for plasma are opposite (cusp form) each other, the plasma 8 becomes to be more stable. When the drawing efficiency of plasma 8 is given priority to, or when the trigger-and-anode 6 is disposed at the position to face the cathode surface 4a and not to disturb the progress of plasma 8, the applied magnetic fields can be disposed to be in the same direction (mirror form) each other. In addition, in this case, the arc-stabilization magnetic field generator 30a is arranged around the vacuum chamber 1. However, it can be also disposed in the vicinity of the insulation introduction terminal 26a of cathode 4 in the end of vacuum chamber 1.

Figure 3A:
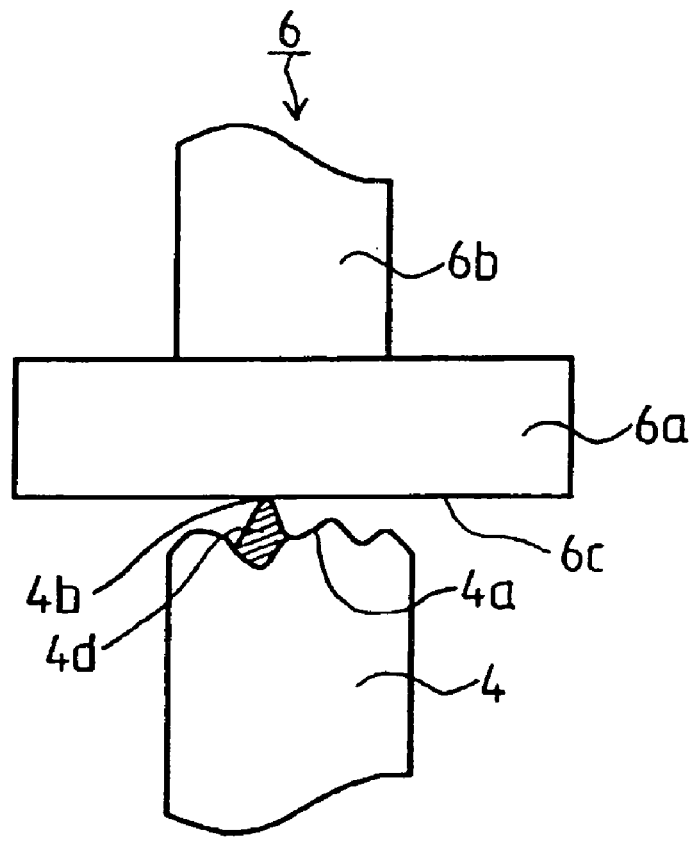
FIG. 3A is a schematic diagram of a contact state between the projection end and the anode surface.

FIG. 3 is a schematic diagram of the contact state between the projection end 4b of cathode surface 4a (or 4f) and the anode surface 6c. FIG. 3A is the schematic diagram of the contact state between the projection end 4b and the anode surface 6c. The projection end 4b and the anode surface 6c come into contact at a contact point. The electric current is flowed into this contact point, and then when the trigger-and-anode 6 was separated from the cathode surface 4a, the electric spark occurs, so that the generation of plasma 8 is induced by this electric spark. After that, by that the plasma 8 or droplet 18 is emitted, the projection 4d disappears.

Figure 3B:
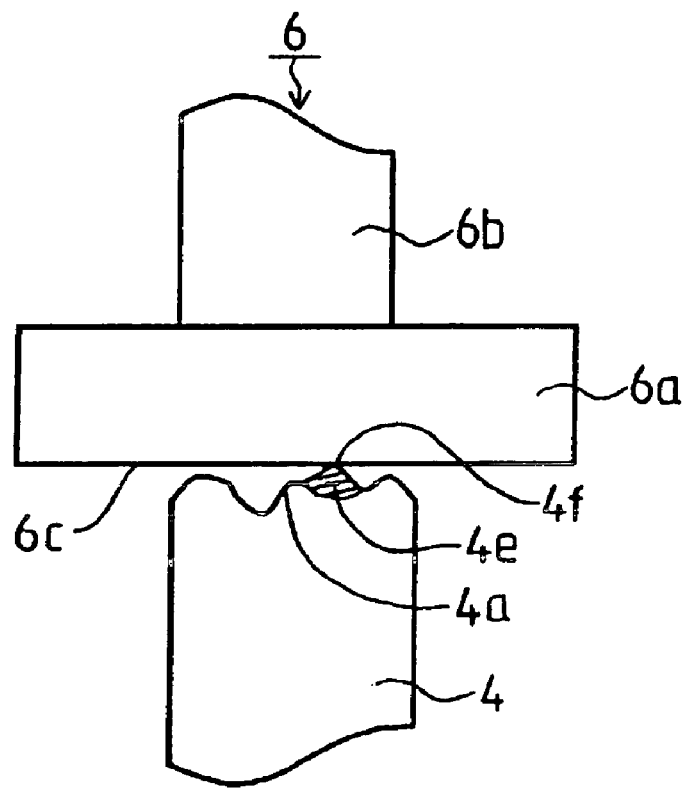
FIG. 3B is a schematic diagram of the contact state between the projection end 4*f* and the anode surface 6*c*.

FIG. 3B is the schematic diagram of the contact state between the projection end 4f and the anode surface 6c. In FIG. 3B, the projection 4d of FIG. 3A disappears, and the projection end 4f becomes the cathode point by coming into contact with the anode surface 6c. Furthermore, when the projection 4e disappeared by the vacuum arc discharge, the other projection approaching the anode surface 6c most becomes the cathode point. In the plasma emission mechanism described above, one projection changes to recess and then new projection is formed, so that the cathode surface always holds the unevenness surface, and the cathode 4 is gradually worn out and continues to retreat. In other words, the cathode surface always holds the unevenness shape, and the projection of this cathode surface forms a good cathode point.

Figure 4:
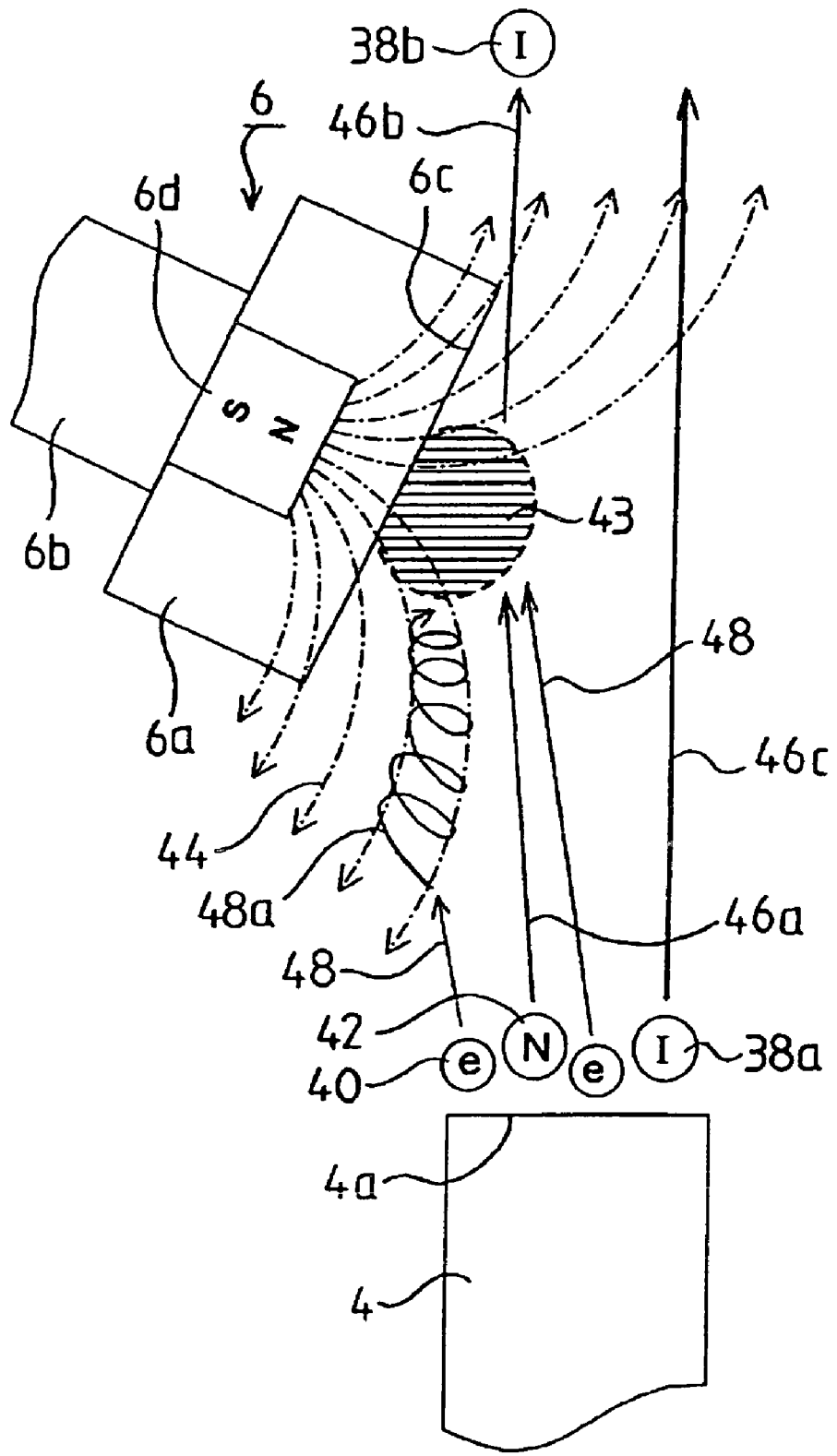
FIG. 4 is an explanatory diagram of the trigger-and-anode of active anode type concerning the present invention.

FIG. 4 is an explanatory diagram of the trigger-and-anode of active anode type. In the trigger-and-anode 6 of active anode type, magnet 6d (electromagnet or permanent magnet) is arranged. Practically, since the magnet 6d is buried in the trigger-and-anode 6, the permanent magnet is easy to be treated. By magnetic field 44 occurring by means of magnet 6d, the density of line of magnetic force increases near the anode surface. Therefore, in the vicinity of the anode surface, the electrons 40 emitted from cathode surface 4a coils around the line of magnetic force by Larmor motion, so that the density of electrons near said anode surface increases and the plasma high-density domain 43 is formed with ions attracted to said electrons.

Here, the electronic orbit 48a emitted from cathode, the ion emission direction 46c, the neutral atom emission direction 46a and the plasma high-density domain 43 (plasma plume) are typically showed, but the real orbit of each particle is not illustrated. The tip end portion 6a of said trigger-and-anode 6 of active type or the anode surface 6c can be also formed from the plasma generating substance. In this case, if the tip end portion 6a of said trigger-and-anode 6 or the anode surface 6c is formed from substance different from the cathode 4, the plasma composed of two kinds of elements can be generated.

Furthermore, the neutral atoms 42 emitted from said cathode 4 to the neutral atom emission direction 46a are incident into the plasma high-density domain 43, and then the plasma components are formed (called "re-activation" as follows) by ionization of said neutral atoms 42. Therefore, the plasma can be generated with high efficiency because said trigger-and-anode 6 forms the active anode.

Figure 5A:
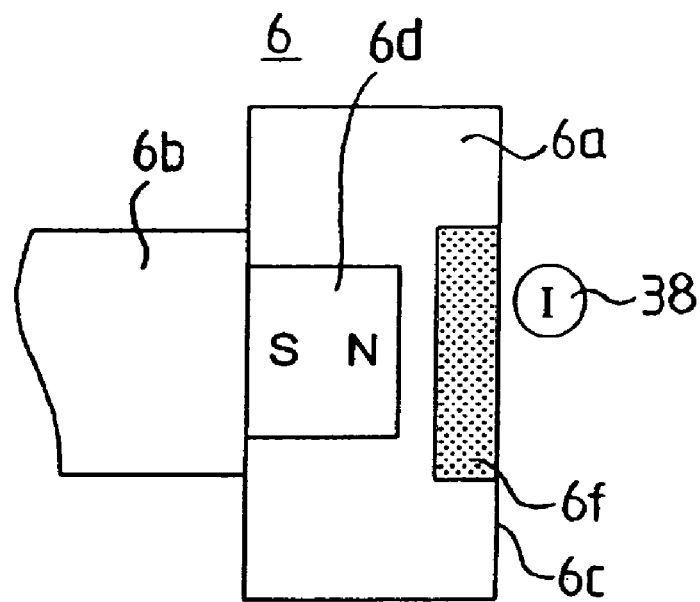
FIG. 5A is a schematic diagram of the trigger-and-anode in which the magnet and the plasma generating substance are arranged.

FIG. 5 is a schematic diagram of the trigger-and-anode of active anode type. By arranging the plasma generating substance on one part of the trigger-and-anode tip, the active anode is formed. FIG. 5A is a schematic diagram of the trigger-and-anode 6 in which the magnet 6d and the plasma generating substance 6f are arranged. The magnet 6d is arranged on the tip end portion 6a of trigger-and-anode 6. As described earlier, the high-density domain of plasma is formed in the vicinity of the anode surface by arranging the magnet 6d on the tip end portion. The plasma composing the high-density domain heats and sputters said anode surface by means of heat and ion-electron bombardment, and the evaporation of plasma generating substance buried under said anode surface is induced.

Figure 5B:
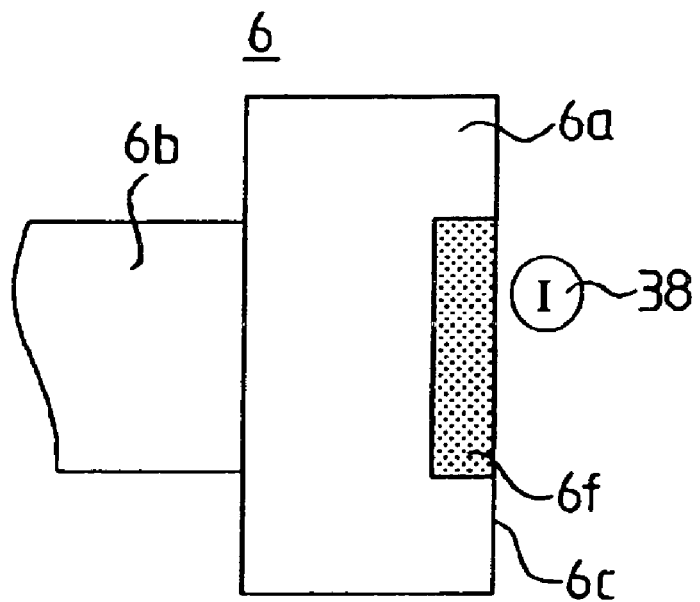
FIG. 5B is a schematic diagram of the trigger-and-anode in which the plasma generating substance is arranged.

FIG. 5B is a schematic diagram of the trigger-and-anode in which the plasma generating substance 6f is arranged. As for this trigger-and-anode, the magnet is not arranged. In this case, the plasma can be also emitted from the anode surface, so that there can be formed the plasma which contains the material different from the cathode material.

Figure 6:
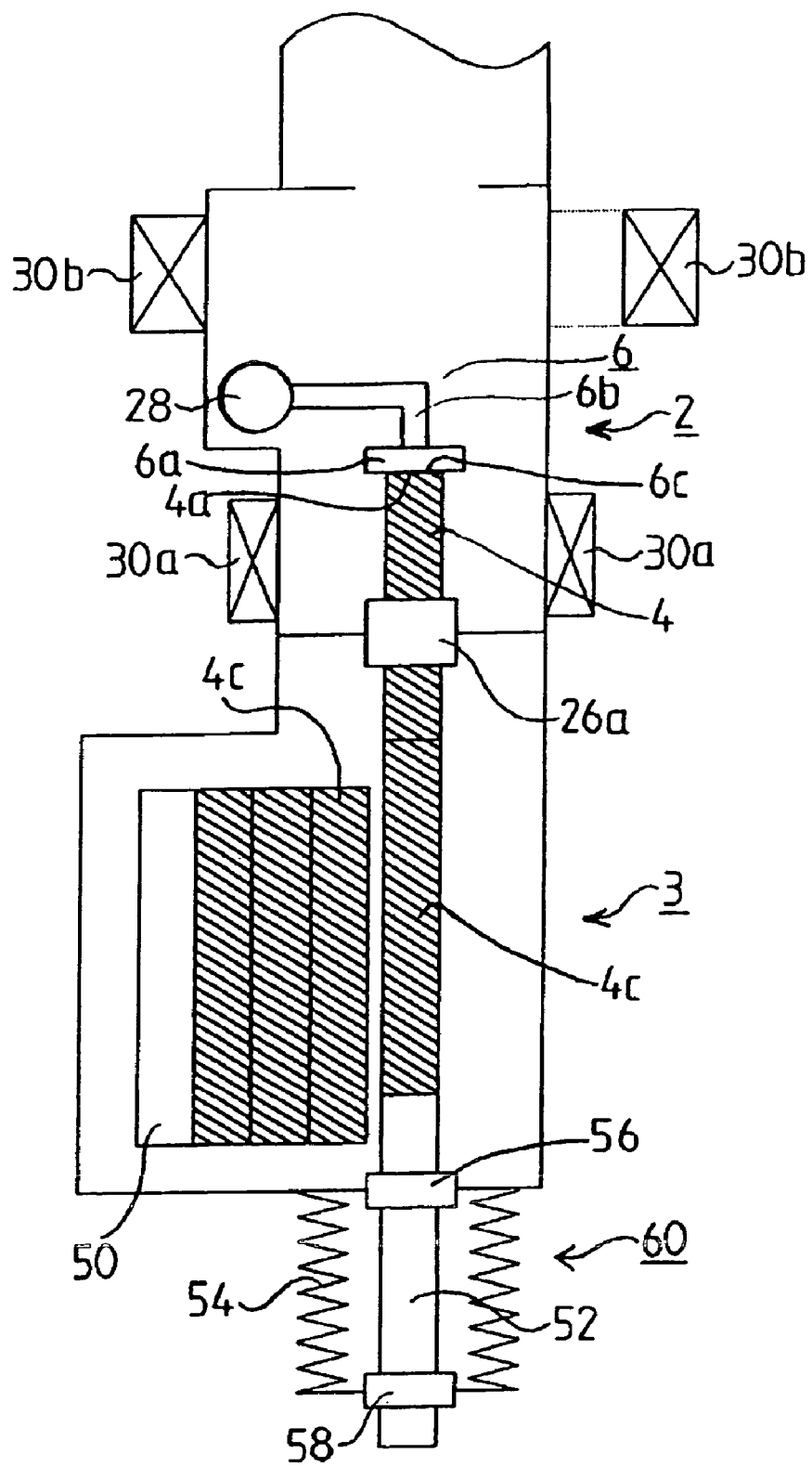
FIG. 6 is a schematic diagram of the plasma generating portion providing the cathode material loading device concerning the present invention.
Figure 7:
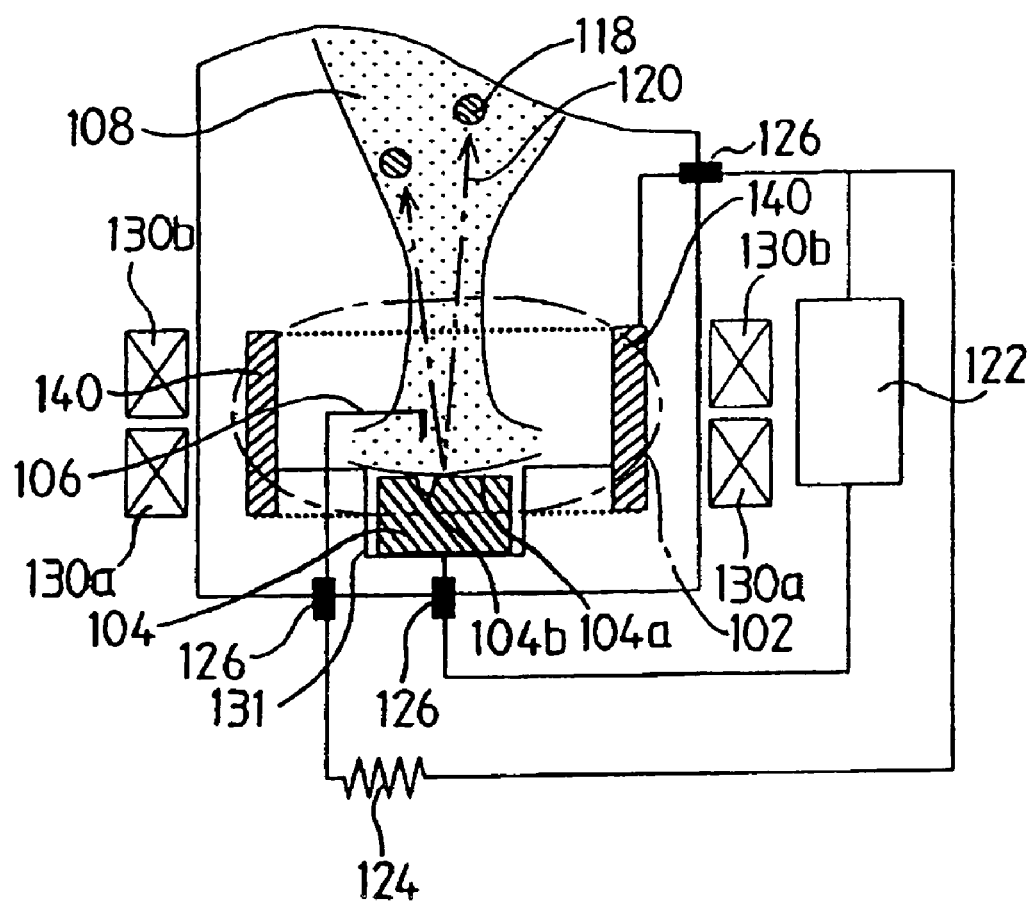
FIG. 7 is a schematic diagram of the plasma generating portion in a conventional plasma generator.
Figure 8:
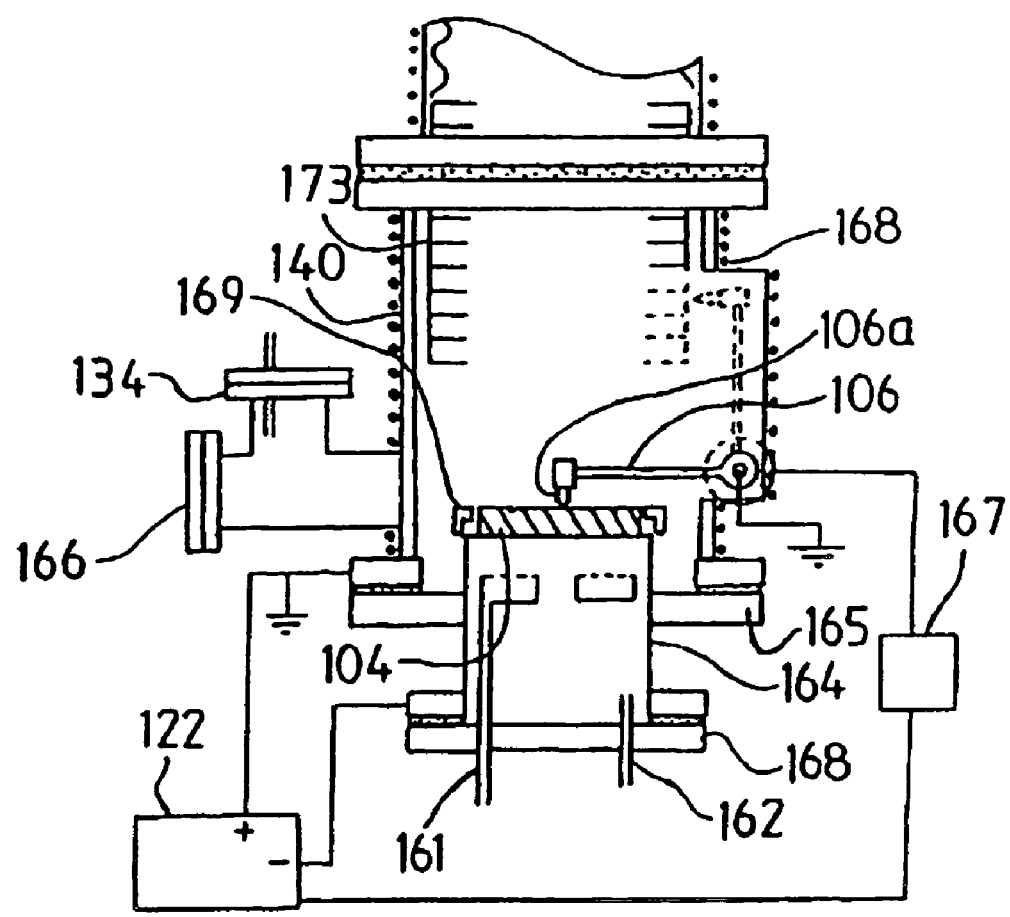
FIG. 8 is a schematic diagram of the plasma generating portion in a conventional plasma generator.

FIG. 6 is a schematic diagram of the plasma generating portion 2 providing the cathode material loading device 3. The basic structure of said cathode material loading device 3 is composed of the cathode extra material 4c and the loading portion 60.

With decrease of cathode 4 during operation, said cathode extra material 4c is pushed out by said loading portion 60. Therefore, when the cathode 4 was perfectly worn out (consumed), the cathode materials are supplied, so that the plasma can be continually generated without stopping of generation of plasma. Said loading portion 60 is configured from the loading member 52 advancing the cathode material, the vacuum bellows 54 to push said loading member 52 in vacuum, the push-out mechanism 58 of the loading member 52 and the supporting member 56 to insert said loading member 52 smoothly. Although it is not illustrated, in order to supply the cathode extra material 4c from the storage room 50, when the loading member 52 advanced beyond the length of cathode extra material 4c, a driving device to return this loading member 52 backward may be installed. In addition, the whole push-out mechanism may be put in vacuum room without the use of said vacuum bellows.

Furthermore, the continuous operation of long time is enabled by arranging the storage room 50 with the cathode material loading device 3. The cathode extra material 4c is stored in said storage room 50. When the cathode 4 was worn out, the following cathode extra material 4c is moved to the plasma generating portion 2, and then the cathode extra material 4c stored in the storage room 50 is supplied as a follower of cathode 4, sequentially. This storage room 50 can be expanded freely according to the continuous operating time.

It is needless to say that the present invention is not limited to the above-described embodiments; and various modifications and design changes, etc. are included in the scope of the present invention within this limits which do not deviate from the technical spirit of the present invention.

INDUSTRIAL APPLICABILITY

The plasma generator of the present invention is configured from the cathode surface having the flatness or the minute unevenness shape, and the anode surface having the flat surface, wherein both surfaces are arranged so as that said anode surface comes into contact at least with the entire surface of the cathode surface at the time of plasma start. The projection end of said cathode surface coming into contact with said anode surface becomes the plasma emission point. When one projection end was consumed, the other projection end capable of contacting with said anode becomes a new plasma emission point at the next plasma start, so that the plasma can be generated intermittently. Therefore, by using of the plasma generator of the present invention, the repeatedly intermittent surface improving treatment such as ion injection and etching can be performed continuously for a long time in semiconductor production processes. Furthermore, when the plasma generator disposing the cathode material loading device is used, the surface treatment processing can be performed by supplying of the cathode material without opening of the vacuum chamber, so that it is prevented to mix the impurities and contamination onto the surface of processed object. That is to say, by using of the plasma generator of the present invention, under the state holding the high quality and the high purity, the plasma treatment for processed object can be performed continuously for a long time.

The invention claimed is:

1. In a plasma generator in which a plasma is generated by a vacuum arc discharge performed in a plasma generating portion set under a vacuum atmosphere, and generate plasma, said plasma generator characterized in that a trigger-and-anode for starting and sustaining of said vacuum arc plasma and a cathode are arranged in said plasma generating portion, a cathode surface of said cathode is finely irregular and has a plurality of projections, an anode surface of said trigger-and-anode brought into contact with said cathode surface is flat, and said anode surface is so arranged as to be brought into contact at least with said whole cathode surface, and wherein said plasma is started when said anode is separated from said cathode surface, and a contact point between one of said plurality of projections of said finely irregular surface of said cathode and said anode surface becomes a plasma emission point.

2. The plasma generator according to claim 1, wherein a driving mechanism is provided at said trigger-and-anode, so that said trigger-and-anode can move for repetition between an arc plasma starting position and a plasma collision avoiding position by said driving mechanism.

3. The plasma generator according to claim 1, wherein a driving mechanism is connected to a base end portion of said trigger-and-anode, so that said trigger-and-anode can swing for repetition between an arc plasma starting position and a plasma collision avoiding position as a fulcrum in said driving mechanism.

4. The plasma generator according to any of claims 1 to 3, wherein said trigger-and-anode is formed in a hammer shape having an anode base end portion of a narrow width and an anode tip end portion of wide width, and a tip end surface of said anode tip end portion becomes said anode surface.

5. The plasma generator according to any one of claims 1 to 3, wherein a tip end portion of said trigger-and-anode is composed of a plasma generating substance.

* * * * *